United States Patent [19]

Thompson et al.

[11] Patent Number: 5,969,368

[45] Date of Patent: Oct. 19, 1999

[54] BACKSIDE THINNING USING ION-BEAM FIGURING

[75] Inventors: Dennis A. Thompson, Scottsville; Bryan L. Howe, Honeoye Falls, both of N.Y.

[73] Assignee: Eastman Kodak Company, Rochester, N.Y.

[21] Appl. No.: 09/067,485

[22] Filed: Apr. 27, 1998

Related U.S. Application Data

[62] Division of application No. 08/625,603, Mar. 29, 1996, Pat. No. 5,786,236.

[51] Int. Cl.$^6$ .................................................. H01J 37/304
[52] U.S. Cl. ...................................... 250/492.3; 250/492.2
[58] Field of Search .............................. 250/492.3, 492.2, 250/492.1, 309

[56] References Cited

U.S. PATENT DOCUMENTS

| | | | |
|---|---|---|---|
| 3,988,564 | 10/1976 | Garvin et al. ............................ | 219/121 |
| 4,639,301 | 1/1987 | Doherty et al. ...................... | 204/192.31 |
| 4,976,843 | 12/1990 | Ward et al. ......................... | 204/298.36 |
| 5,273,935 | 12/1993 | Morimoto et al. .................... | 250/492.2 |
| 5,401,972 | 3/1995 | Talbot et al. ......................... | 250/492.3 |
| 5,786,236 | 7/1998 | Thompson et al. ........................ | 438/60 |

*Primary Examiner*—Kiet T. Nguyen
*Attorney, Agent, or Firm*—James D. Leimbach

[57] ABSTRACT

A product and process for making backside thinned semiconductor image sensing devices employing neutral ion beams to reduce substrate volumes so that the image sensor can be illuminated from the backside, or side opposite etched circuitry. A neutral ion beam is contained in a vacuum chamber that has a fixture for holding a semiconductor image sensor, a control mechanism for controlling the neutral ion beam via the raster mechanism, and a map of the semiconductor image sensor. The image sensor is placed on the fixture within the vacuum chamber and the neutral ion beam removes a predetermined amount of substrate from the backside of the sensor. The result is an image sensor than can be backside thinned at the molecular level

11 Claims, 3 Drawing Sheets

BACKSIDE THINNING USING ION-BEAM FIGURING

CROSS REFERENCE TO RELATED APPLICATIONS

The present application is a divisional application of U.S. patent application No. 08/625,603, filed on Mar. 29, 1996, which has issued as U.S. Pat. No. 5,786,236.

FIELD OF THE INVENTION

The invention relates generally to the field of image sensors, and in particular to backside thinning of charge coupled devices.

BACKGROUND OF THE INVENTION

In photo detector array fabrication, it is sometimes necessary to have devices which are thinned from the backside due to operational requirements. These requirements may include but are not limited to; maximizing UV spectral response; minimizing sensitive volume thickness; and anti-blooming considerations. Difficulties arise in mechanically or chemically thinning or removing the substrate, if the devices are physically small, or the feature size of the device is small, or the doped layers are very thin. Mechanically stressing the device should be minimized. In addition, thinning the substrate may effectively remove the ground path from the device, depending on design. Accuracy in thinning is necessary to achieve uniformity of response.

Previous techniques within the prior art for backside thinning of image sensors have been disclosed such as the chemi-mechanical illustrated in U.S. Pat. No. 5,162,251 issued to Poole et al. (hereinafter referred to as Poole). Other prior art techniques have disclosed chemical etching techniques for backside thinning such as U.S. Pat. No. 5,244,817 issued to Hawkins et al. (hereinafter referred to as Hawkins). Neither of these teachings provide the ability to thin substrates in both a timely and accurate manner.

As can be seen from the foregoing discussion, there remains a need within the art for a method and apparatus that can effectively thin semiconductor image sensor substrates highly accurately and in a timely manner.

SUMMARY OF THE INVENTION

The present invention is directed to overcoming one or more of the problems set forth above by applying a neutral ion beam to the backside of image sensing devices to thin the devices by removing substrate at a molecular level. The process leaves a backside surface that is as smooth as the surface was prior to beginning the backside thinning process. Briefly summarized, according to one aspect of the present invention, a method for making backside thinned image sensors comprising the steps of:

providing a semiconductor image sensor having circuits etched upon a first major surface;

providing a neutral ion beam having control means for directing the neutral ion beam direction, width, intensity, and individual particle energy;

determining a desired thickness of the image sensor; and etching away a portion of a second surface of the image sensor that is opposite the first surface with the neutral ion beam until the image sensor is of the desired thickness.

The present invention addresses the above discussed problems within the prior art by removing material at the molecular level with virtually no mechanical stresses induced in the device during the thinning process. This can be achieved by the use of ion figuring technology on a small scale to assure uniform and controllable material removal. The technology should be applicable on both the wafer and the device level. The present invention further addresses the backside thinning of a photo detector array after it has been mounted in its package. Precautions will have to be taken to minimize possible charging and layer doping effects. It is envisioned that a small ion figuring system would be sufficient in performing the process of the present invention. The small beam size achievable with a small ion configuring system and the fine control provided by its software are seen as suitable for creating the device envisioned by the present invention.

The above and other objects of the present invention will become more apparent when taken in conjunction with the following description and drawings wherein identical reference numerals have been used, where possible, to designate identical elements that are common to the figures.

ADVANTAGEOUS EFFECT OF THE INVENTION

The present invention has the following advantages: (1) dual band sensing is possible; (2) it is possible to thin devices while contained in packages; (3) minimal mechanical stress on the device substrate; (4) permits more aggressive thinning of devices due to this being a non-contact, low stress approach; (5) it provides for a high degree in uniformity of thinned devices; (6) devices can be tuned and different photoresponse curves can be achieved; and (8) allows for systems in which multiple devices can be processed together.

DETAILED DESCRIPTION OF THE INVENTION

Figure 1:
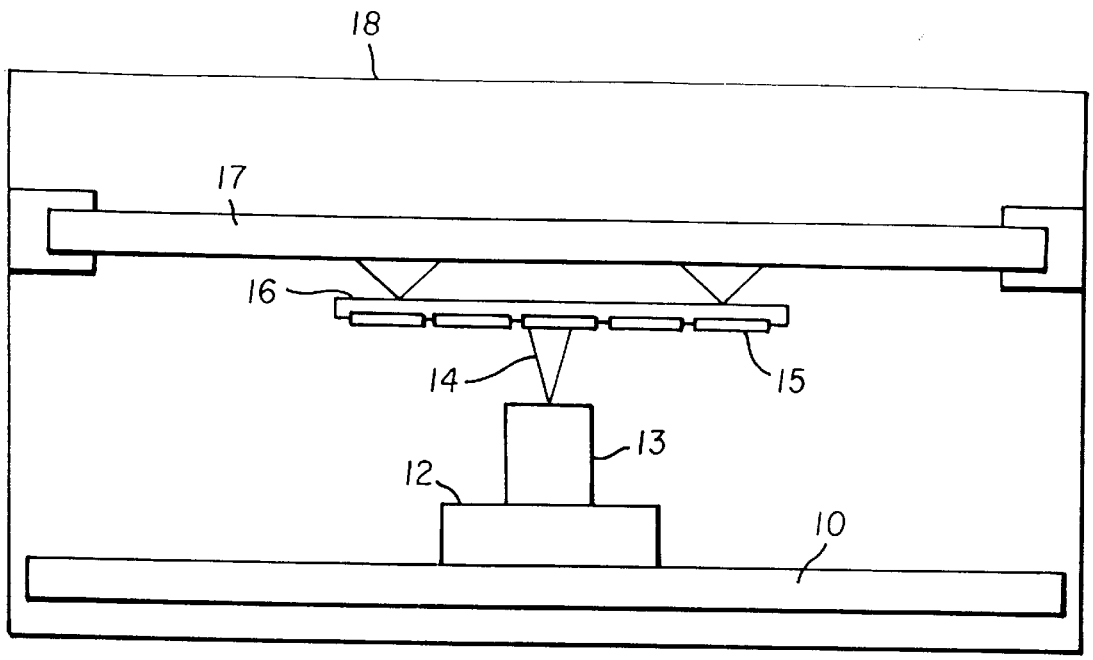
FIG. 1 is a representation of an ion milling system.

We have discovered that the backside of a substrate on a semiconductor sensing device may be thinned using neutral ion beams. Referring to FIG. 1, the use of neutral ion beams to remove material from a surface has been implemented for several years with applications towards the generation of precisely defined surfaces, such as those required in very high quality optical surfaces. This has generally been referred to as ion beam milling or ion beam figuring. As represented in FIG. 1, a typical ion milling system in operation consists of an ion source support structure 10, which incorporates an X-Y translation stage 12. The X-Y translation stage 12 moves the beam source 13 into its proper position under computer control. Generally, the beam source itself is not modulated (which could change both the width and intensity of beam 14). Rather, the dwell time, which here is the time that the beam is held at a given location, is controlled to provide the deterministic removal of material required. Energy deposited in the parts due to the impacts of the ion particles can heat the sample, and this must be taken into consideration when determining removal rates and dwell times. Multiple transits of the part 15 being milled may be required to yield the necessary removal and precision of the final surface.

As envisioned by the present invention, the system of FIG. 1 can be used to reduce the backside surface. The backside surface of the parts being milled will be traversed by the neutral ion beam thereby, having material removed under the impact of the atoms in the beam. For a beam having a given particle energy, the removal rate of material from the part is directly proportional to the number of atoms incident on the surface.

In milling the samples 15 as shown in FIG. 1, some form of support must be provided to the sample 15 while neutral ion beam 14 is being applied. Preferably, the sample 15 is mounted on part carrier 16 which in turn is mounted on carrier support structure 17. The entire system must be enclosed in a vacuum chamber 18. Traditionally, single parts such as large optics, have been mounted in this system. As envisioned by the present invention, however, many smaller parts would typically be incorporated into a single processing run. With each of the parts mounted on the appropriate carrier.

Ion figuring must be carried out in an evacuated environment 18 to avoid corrupting the beam. Additionally, the ion milling is generally carried out with the hardware in the orientation as shown in FIG. 1, with the beam directed upward and the parts 15 that are being milled facing downward. This allows the system 18 to take advantage of the force of gravity to minimize the re-deposition of material, which must be considered a contaminant, back onto the part(s) being treated. To minimize possible doping effects, beam directions other than normal, meaning perpendicular to the substrate, may be used. The neutral beam angle may need to be deviated from normal to prevent doping effects within the substrate. Additionally, or instead of, the energy used to accelerate the neutral ion beam can be fluctuated to prevent ions from penetrating the surface of the substrate. Thereby, restricting material removal to the top layers of the substrate.

The ion beam referred to herein, is a neutral ion beam. A neutral ion beam employed as envisioned by the preferred embodiment comprises a charged atomic ion, that is positively charged and the beam will include essentially an equal amount of electrons. Only by having the particles separate at the beams source is it possible to accelerate the particles to provide the impact needed on the part surface. For this type of system, the atomic ion preferred is Argon. However, it will be understood to those skilled in the art that numerous other ions, such as a krypton, could also be used. At the same time, it is desirable not to charge the surface being milled since this will encourage the redeposition of the material back onto the part. In the case of semiconductor materials which are the subject of this application, it might also be possible to dope the material in an undesirable manner. To minimize these possibilities, an electron beam is included within the atomic ionic beam, resulting in no net charge being transmitted to the part. In fact significant recombination can occur during transit to the part. Recombination will not hamper the effectiveness of the beam since the particles within the beam have already been accelerated and are traveling at similar velocities when recombination occurs.

Figure 2:
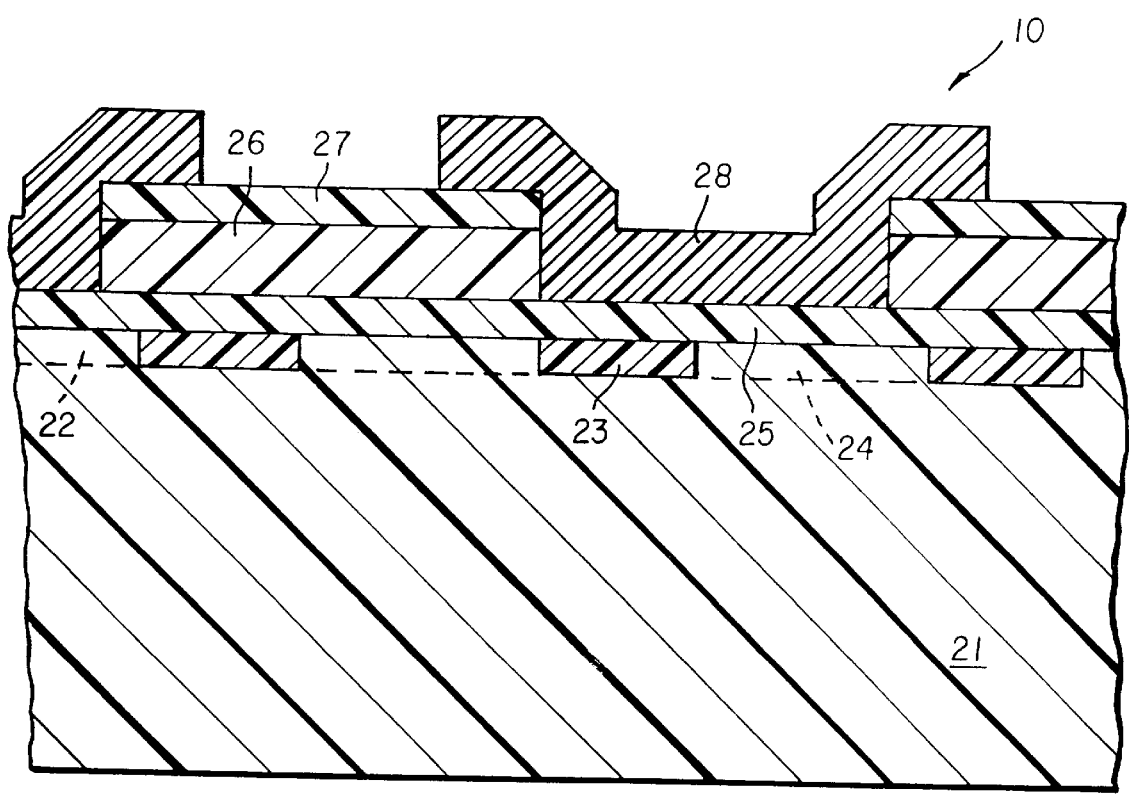
FIG. 2 is a cross-sectional representation of a photosensitive device.

FIG. 2 illustrates the type of solid state detector envisioned by the preferred embodiment of the present invention. The considerations presented here are not limited to this specific device. Hence this configuration should be considered as a representation of the type of technology as envisioned by the preferred embodiment only, other configurations will be readily apparent to those skilled in the art. Substrate 21, formed of a p-type semiconductor material, has formed thereon: buried channel 22 formed from an n-type material; transfer region 23; storage region 24; gate oxide 25; 1st poly-Silicon layer 26; 2nd poly silicon layer 28; isolation oxide 27; to form device 20. The system illustrated in FIG. 2 suffers from a sensitivity problem which is a function of the responsivity of the material to electromagnetic radiation. In the simplest sense, the photoresponsivity of such a device is measured by the effectiveness with which a photon will generate an electron-hole pair within the substrate 21, but near enough to the storage and transfer regions to be collected and moved by the clocking of the gates.

Figure 3:
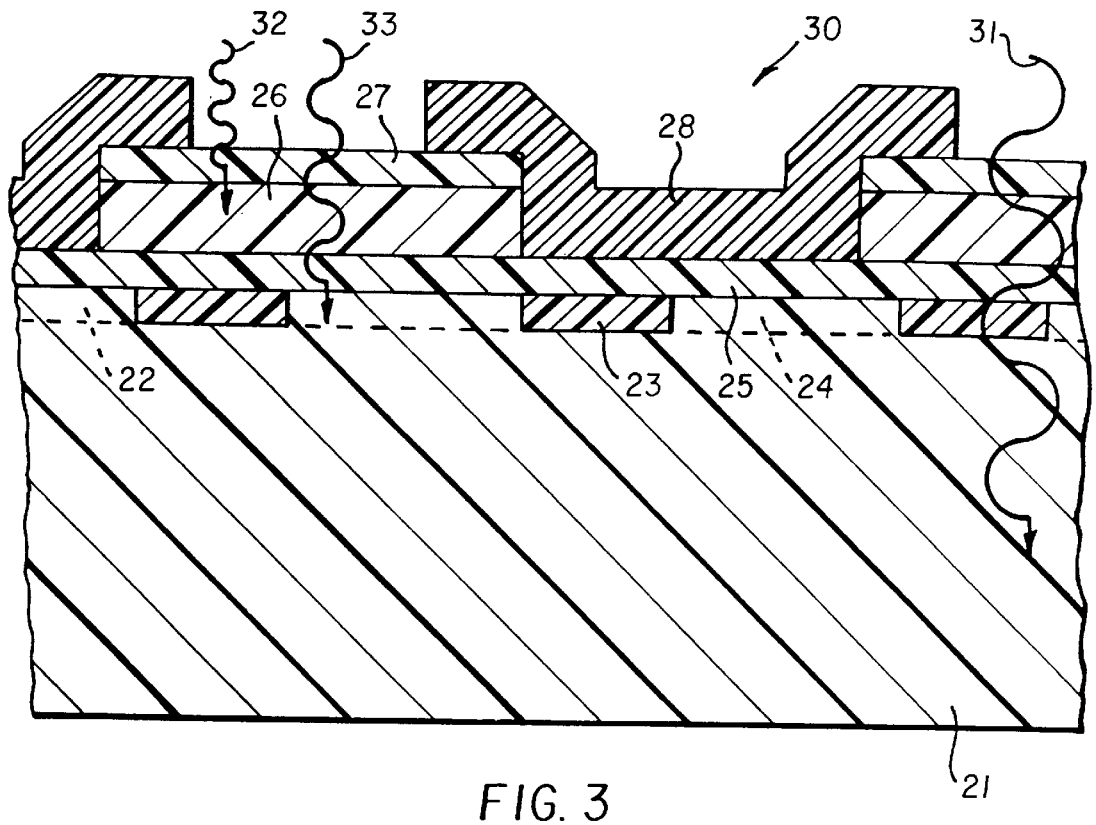
FIG. 3 is a diagram illustrating the penetration depths of various wavelengths.

Referring now to FIG. 3, which is a diagram indicating that longer wavelength radiation penetrates deeper into the material, it is apparent that infrared (IR) radiation, indicated as arrow 31, penetrates more deeply into the material. The penetration may be so deep that the electrons generated by the IR radiation may not have the time to move to the collection and storage area before being clocked out. Such charge may be collected in later clock cycles and/or at adjacent pixels, thus corrupting the desired image information or reducing the imager Modulation Transfer Function (MTF). In contradistinction to the phenomena that exists with the IR radiation, ultraviolet (UV) radiation 32 does not even penetrate through the 1st poly-silicon 26 and isolation oxide 27 layers to generate charge in the collection region. The nominally visible wavelengths 33 are the only ones which penetrate to the appropriate depth to be used to generate image or photon collection information.

Figure 4:
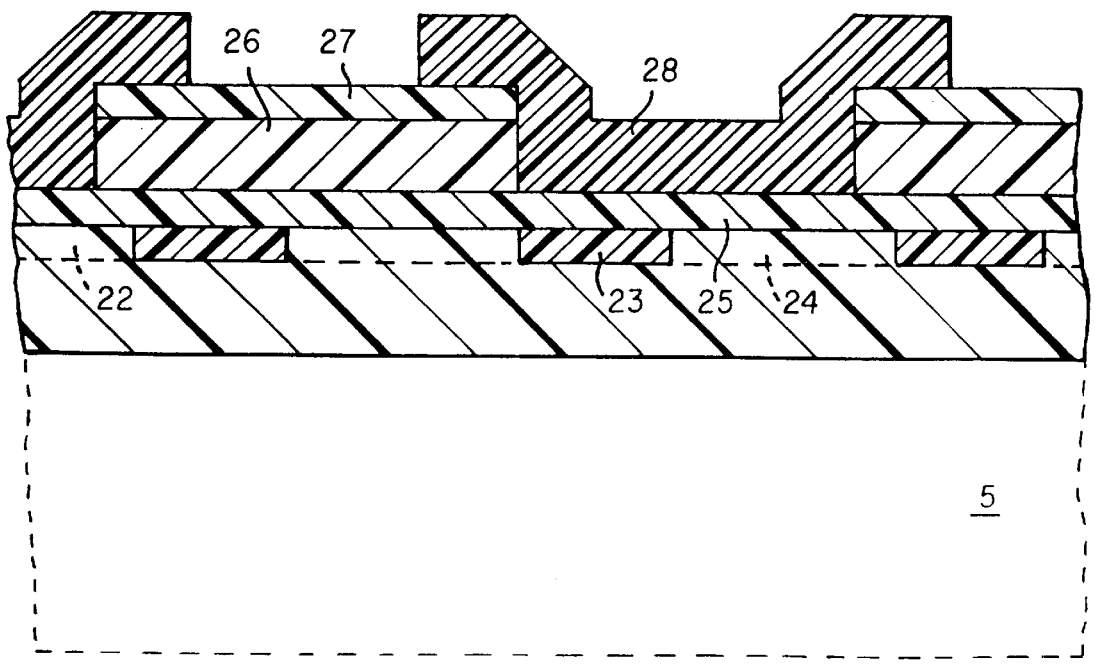
FIG. 4 is an illustration of a sensor showing the portion of the substrate removed by the neutral ion beam.
Figure 5:
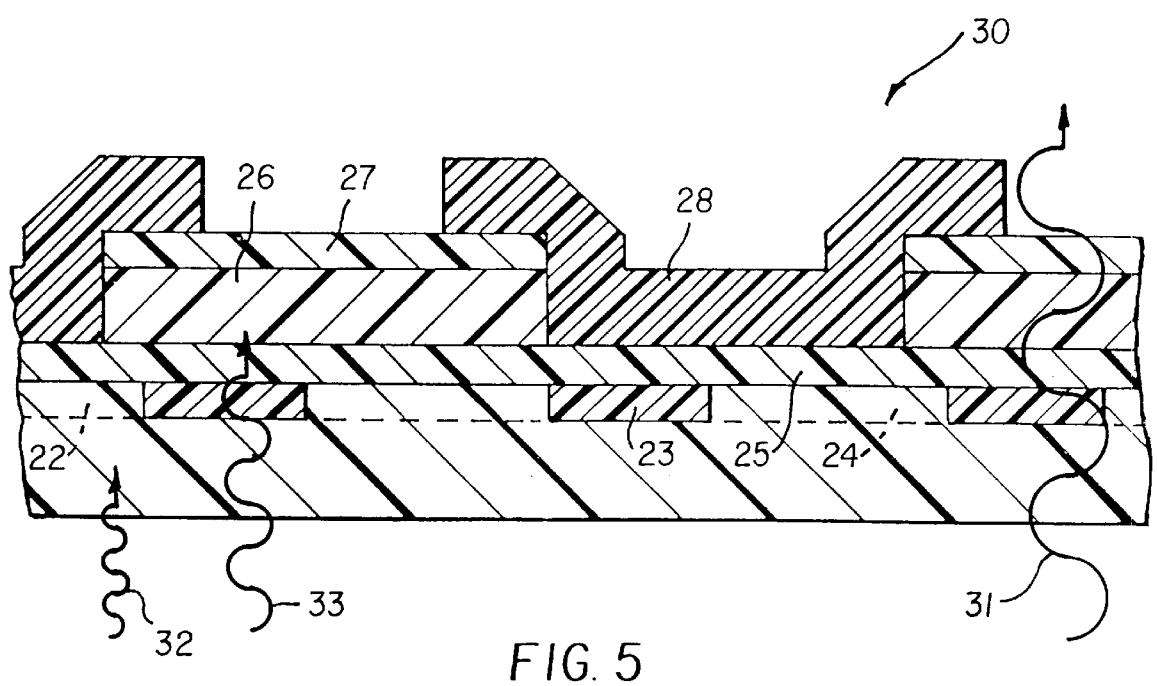
FIG. 5 is an illustration of a backside thinned device with incident radiation on the backside.

Referring to FIG. 4, which is an illustration of the device 20 of FIG. 3 indicating the portion of the substrate that is to be removed by the neutral ion beam, indicated by dotted line 5. The overall manner of use of this device is changed by thinning the substrate 21 of FIG. 4 by the amount shown by dotted line 5 resulting in the device of FIG. 5 having thinned backside substrate 31, to the extent that incident radiation can be brought into the collection region 29 and storage areas 25 from the back side of the device 30 in FIG. 5. FIG. 5 is a typical backside thinned operation used in technical approaches in the scientific community and is created from the device shown in FIG. 4. Typically, these thinned devices are created using the mechanical milling or chemical etching techniques previously discussed. While, both of these approaches can be used, the neutral ion beam removal technique discussed herein has the numerous advantages previously discussed.

The novel approach of employing ion-assisted milling to backside thin image sensors, has not been used to process semiconductor devices of this type, or in this manner. Ion figuring, which is essentially the removal of material on the atomic level, has several advantages including: minimization of the mechanical stress of the milled target; a high degree of being able to determine the amount of material being removed when the material has been suitably characterized; and, if suitably controlled, the minimization of excess heating of the part being milled.

It is envisioned that the ion thinning process discussed in the present invention be employed to create sensor devices having dual band capabilities. By thinning a device such that the device is thinned more in one area than another, dual band sensing areas are thereby created by having a first portion of the device sensitive to one wavelength and a second portion of the device sensitive to a different wavelength. This multiple band sensor can be created by the neutral ion beam process of the present invention. Here, it is possible to form combinations of infrared, visible, ultraviolet or X-ray sensitivity in a single sensor. Emphasis for silicon sensors is envisioned to be on enhanced blue and UV response but not limited, thereto. Dual band visible and IR sensors comprising PtSi, PdSi, IrSi, for example, are also envisioned.

Backside thinning via a neutral ion beam is a technique that provides assistance in controlling the quantum efficiency and the Modular Transfer Function (MTF) of a device. The control of these parameters by the present invention yields superior parameters and has a positive effect on device performance. This is due essentially to receiving light from the backside for illumination purposes. When illuminated from the backside, there are no gate structures to interfere with the quantum efficiency of the device as there would be when the device is illuminated from the front side where circuit gates are formed.

Silicon based sensors are mounted in carriers to facilitate mounting and alignment to an optical system to form a camera. The process for mounting a front side illuminated silicon sensor (die) includes applying an adhesive layer to the mounting surface of a chip carrier and placing the sensor in the adhesive layer. This process is complicated in backside thinned sensors since the thinning process removes the silicon substrate, weakening the substrate. Conventional methods of creating backside thinned sensors require that the pixel side of the sensor be placed in the adhesive after much of the structural integrity is removed from the die, or an intermediate support structure is used to stiffen the substrate prior to thinning. With the ion-beam material removal approach it is possible to thin the die while mounted in the final package. Thereby, eliminating these steps and making a method that is simpler and easier.

The present invention allows a technique for the backside thinning of devices, wherein, it is possible to thin the device at wafer level with no intermediate support structures. This allows for a great deal of versatility in the manufacturing of backside thinned image sensing devices.

The ion-beam material removal process is a non-contact process which imparts minimal mechanical stress on the device substrate. The material is ablated by the energy of the argon-particles being accelerated towards the surface material being removed. This process is more gentle than polishing or grinding to remove material and results in atomic level particle machining. As long as the substrate surface 21 does not have a varying crystal structure, then the surface of the substrate 31 resulting after the ion etching process will be of the same quality as the surface which existed originally prior the ion etching. It should be noted that the surface will roughen if multiple ingredients are employed within the substrate 21. This being because varying structural or material configurations can exhibit different removal rates. Also, it should be noted that application of a silicon overcoat will not result in any appreciable roughening.

Permits achievement of more aggressive thinning due to this being a non-contact/low stress approach. Thinning of the substrate to the 25 $\mu$m thickness level is desirable for highest optical performance (minimizing IR response for instance). The determinism and ease of removal will allow a high yield process.

By backside thinning using a neutral ion beam, the uniformity of the final device is very high and the time required in accomplishing the process is very predictable, in other words the technique is very deterministic.

The techniques taught herein, allow the tuning of the device responsivity by the level of thinning applied deterministically. Starting from the same device design, different photoresponsive curves can be achieved. This allows for a great deal of automation in the process. Also the process can be dynamically altered to provide devices having different responses within an assembly line.

The applications for these backside thinned devices include: remote sensing; environmental monitoring; military imaging; astronomical observations; laser communications; telecommunications, radiation monitors for area; TDI linear; linear; or multiple linear array applications, where a high level of control in the wafer or device thickness is required.

In creating the devices as envisioned by the present invention, processes in which the part or gun are moved can be employed, multiple parts either in wafer form or packaged may be processed together. These possibilities again allow for a great deal of versatility in the manufacturing process. By allowing for the ability to control the manufacturing process to achieve adjustable wafer, or device, thickness by providing for uniform removal of substrate material via the neutral ion beam, the process of the present invention allow for compensation of focus, raw wafer fabrication variability, and assures that highly uniform thickness of wafers is achievable.

The basic elements required to perform the process taught by the present invention:

neutral ion beam gun (gas supply)

vacuum chamber raster mechanism fixture masking—in package multiple guns based upon size of area computer controls to coordinate hit map knowledge of removal rates and energy deposits possible before thermal damage occurs optical test capability to characterize removal and validate the amount The invention has been described with reference to a preferred embodiment. However, it will be appreciated that variations and modifications can be effected by a person of ordinary skill in the art without departing from the scope of the invention.

| PARTS LIST | |
|---|---|
| 5 | substrate to be removed |
| 10 | support structure |
| 12 | x-y translation stage |
| 13 | neutral ion beam source |
| 14 | ion beam |
| 15 | image sensor sample |
| 17 | carrier support structure |
| 18 | vacuum chamber |
| 20 | unthinned device |
| 21 | substrate |
| 22 | buried channel |
| 23 | transfer region |
| 24 | storage region |
| 25 | gate oxide |
| 26 | 1st level poly-silicon |
| 27 | isolation layer |
| 28 | 2nd level poly-silicon |
| 30 | backside thinned device |
| 31 | infrared radiation |
| 32 | ultraviolet radiation |
| 33 | visible wavelengths |

What is claimed is:

1. An image sensing product made from the steps comprising:

providing a semiconductor image sensor having circuits etched upon a first major surface;

providing vacuum chamber having a neutral ion beam and control means for directing neutral ion beam direction and intensity, a carrier for the image sensor, and a translation drive having means for controlling relative position of the neutral ion beam to the carrier;

placing the semiconductor image sensor within the vacuum chamber on the carrier such that the neutral ion beam will be incident upon a second major surface of the image sensor, the second major surface having no circuitry etched thereon, and being opposite the first major surface; and etching away a predetermined thickness of the image sensor by controlling the neutral ion beam to remove a part of the second surface.

2. The product of claim 1 wherein the step of providing a vacuum chamber having a neutral ion beam further comprises providing the vacuum chamber having the neutral ion beam further comprising argon ions.

3. The product of claim 1 wherein the step of placing the semiconductor image sensor within the vacuum chamber further comprises placing within the vacuum chamber a support structure for the final chip carrier.

4. The product of claim 1 wherein the step of etching away the image sensor by controlling the neutral ion beam to remove a part of the second major surface further comprises controlling the translation drive to move the neutral ion beam in relation to the image sensor.

5. The product of claim 1 wherein the step of etching away the image sensor by controlling the neutral ion beam to remove a part of the second surface further comprises controlling the translation drive sensor in relation to the neutral ion beam.

6. The product of claim 1 wherein the individual steps are provided on a plurality of semiconductor image sensors.

7. A system for backside thinning of image sensors comprising:

a vacuum chamber;

a neutral ion beam gun contained within the vacuum chamber;

a raster mechanism operatively connected to the neutral ion beam for controlling movement of the neutral ion beam gun;

a fixture for holding a semiconductor image sensor that has etched circuitry on a first major surface such that the first major surface of the image sensor is not facing the neutral ion beam gun and a second major surface of the image sensor is facing the neutral ion beam gun;

control means for controlling the neutral ion beam via the raster mechanism to etch away the second major surface; and a map of the semiconductor image sensor.

8. The system of claim 7 wherein the neutral ion beam further comprises an argon ion beam.

9. The system of claim 7 wherein the control means further comprises a translation drive to move the neutral ion beam in relation to the image sensor to etch away the image sensor by controlling the neutral ion beam to remove a part of the second major surface of the image sensor.

10. The system of claim 7 wherein the control means etches away the image sensor by controlling the neutral ion beam to remove a part of the second surface of the image sensor farther comprises controlling the translation drive sensor in relation to the neutral ion beam.

11. The system of claim 7 further comprising a plurality of semiconductor image sensors.

* * * * *